US011912860B2

(12) United States Patent
Cook et al.

(10) Patent No.: US 11,912,860 B2
(45) Date of Patent: Feb. 27, 2024

(54) HIGHLY LOADED INORGANIC FILLED ORGANIC RESIN SYSTEMS

(71) Applicant: CORNING INCORPORATED, Corning, NY (US)

(72) Inventors: Laura Beth Cook, Corning, NY (US); Laura Jeanne Cunneen, Lawrenceville, PA (US); Richard Curwood Peterson, Elmira Heights, NY (US); Kathleen Ann Wexell, Corning, NY (US)

(73) Assignee: CORNING INCORPORATED, Corning, NY (US)

( * ) Notice: Subject to any disclaimer, the term of this patent is extended or adjusted under 35 U.S.C. 154(b) by 821 days.

(21) Appl. No.: 17/043,039

(22) PCT Filed: Mar. 29, 2019

(86) PCT No.: PCT/US2019/024801
§ 371 (c)(1),
(2) Date: Sep. 29, 2020

(87) PCT Pub. No.: WO2019/191564
PCT Pub. Date: Oct. 3, 2019

(65) Prior Publication Data
US 2021/0047510 A1 Feb. 18, 2021

Related U.S. Application Data

(60) Provisional application No. 62/649,819, filed on Mar. 29, 2018.

(51) Int. Cl.
| | |
|---|---|
| *C08F 2/46* | (2006.01) |
| *B29C 64/129* | (2017.01) |
| *B29C 64/35* | (2017.01) |
| *B33Y 70/10* | (2020.01) |
| *C08F 2/50* | (2006.01) |
| *C08G 61/04* | (2006.01) |
| *C08J 7/12* | (2006.01) |
| *C08K 3/40* | (2006.01) |
| *C08K 9/02* | (2006.01) |
| *C08L 33/08* | (2006.01) |
| *C08L 63/00* | (2006.01) |
| *B29K 33/00* | (2006.01) |
| *B29K 63/00* | (2006.01) |

(52) U.S. Cl.
CPC ............ *C08L 63/00* (2013.01); *B29C 64/129* (2017.08); *B29C 64/35* (2017.08); *B33Y 70/10* (2020.01); *C08J 7/126* (2013.01); *C08K 3/40* (2013.01); *C08K 9/02* (2013.01); *C08L 33/08* (2013.01); *B29K 2033/08* (2013.01); *B29K 2063/00* (2013.01)

(58) Field of Classification Search
CPC .......... C08L 63/00; C08L 33/08; B33Y 70/10; B29K 2063/00; B29K 2033/08; C08J 7/126; G03F 7/027; G03F 7/0037; G03F 7/0047; G03F 7/038; C08K 3/36; C08K 3/40; C08K 9/06; C08K 9/02; B29C 64/35; B29C 64/129
USPC ............... 522/100, 1, 6, 71, 189, 184; 520/1
See application file for complete search history.

(56) References Cited

U.S. PATENT DOCUMENTS

| | | | |
|---|---|---|---|
| 4,158,688 A | 6/1979 | Pett | |
| 5,602,197 A | 2/1997 | Johnson et al. | |
| 6,117,612 A | 9/2000 | Halloran et al. | |
| 6,899,948 B2 | 5/2005 | Zhang et al. | |
| 7,677,058 B2 | 3/2010 | Hawtof et al. | |
| 8,367,208 B2 | 2/2013 | Glaesemann et al. | |
| 8,598,055 B2 | 12/2013 | Ellison | |
| 8,763,429 B2 | 7/2014 | Danielson et al. | |
| 8,796,165 B2 | 8/2014 | Ellison et al. | |
| 9,517,967 B2 | 12/2016 | Dejneka et al. | |
| 10,562,804 B2 | 2/2020 | Cook et al. | |
| 2005/0040562 A1 | 2/2005 | Steinmann et al. | |
| 2005/0090575 A1* | 4/2005 | Chaput | C04B 35/6263 523/115 |
| 2014/0106172 A1 | 4/2014 | Dejneka et al. | |
| 2015/0140299 A1 | 5/2015 | Ellison et al. | |
| 2016/0346997 A1 | 12/2016 | Lewis et al. | |
| 2017/0321056 A1 | 11/2017 | Matano et al. | |
| 2018/0237325 A1 | 8/2018 | Li et al. | |
| 2020/0299500 A1* | 9/2020 | Cook | C08L 33/26 |

FOREIGN PATENT DOCUMENTS

| | | |
|---|---|---|
| CN | 103756293 A | 4/2014 |
| CN | 105176084 A | 12/2015 |
| CN | 105566860 A | 5/2016 |
| CN | 107418133 A | 12/2017 |

(Continued)

OTHER PUBLICATIONS

Chinese Patent Application No. 201980023722.X, Office Action, dated Jul. 26, 2022, 12 pages, (6 pages of English Translation and 6 pages of Original Copy); Chinese Patent Office.
International Search Report and Written Opinion of the International Searching Authority; PCT/US2019/024801; dated Jul. 18, 2019; 13 Pages; European Patent Office.
Klein et al., "3D printed glass: Surface finish and bulk properties as a function of the printing process", Proceedings of SPIE—The International Society for Optical Engineering, 2015.
Kotz et al., "Three-dimensional printing of transparent fused silica glass". Nature, Apr. 2017, 337-339.

(Continued)

*Primary Examiner* — Jessica Whiteley

(57) ABSTRACT

The disclosure provides high viscosity, organic resin systems incorporating inorganic materials. The resin systems incorporate glasses, glass ceramics, or ceramics in high load levels and are particularly useful for development of three dimensional articles and in additive manufacturing processes. Processes for making the resin systems are also provided.

27 Claims, 2 Drawing Sheets

(56) References Cited

FOREIGN PATENT DOCUMENTS

| CN | 111433268 A | 7/2020 |
|---|---|---|
| FR | 2835827 A1 | 8/2003 |
| JP | 07-026060 A | 1/1995 |
| KR | 10-2015-0077649 A | 7/2015 |
| WO | 00/42471 A1 | 7/2000 |
| WO | 00/51761 A1 | 9/2000 |
| WO | 2016/137956 A1 | 9/2016 |
| WO | 2019/108808 A2 | 6/2019 |

OTHER PUBLICATIONS

Marchelli et al., "The guide to glass 3D printing: Developments, methods, diagnostics, and results", Rapid Prototyping Journal 17/3 (2011), pp. 187-194.

Travitzky et al., "Additive manufacturing of ceramic-based materials", Advanced Engineering Materials, vol. 16, Issue 6, 2014, pp. 729-754.

Wozniak et al., "Highly loaded UV curable nanosilica dispersions for rapid prototyping applications", Journal of the European Ceramic Society, vol. 29, Issue 11, Aug. 2009, pp. 2259-2265.

Wozniak et al., "Rheology of UV curable colloidal silica dispersions for rapid prototyping applications", Journal of the European Ceramic Society, vol. 31, Issue 13, Nov. 2011, pp. 2221-2229.

\* cited by examiner

HIGHLY LOADED INORGANIC FILLED ORGANIC RESIN SYSTEMS

CROSS-REFERENCE TO RELATED APPLICATIONS

This application claims the benefit of priority under 35 U.S.C. § 371 of International Application No. PCT/US2019/024801, filed on Mar. 29, 2019, which claims the benefit of priority under 35 U.S.C. § 119 of U.S. Provisional Application No. 62/649,819, filed Mar. 29, 2018, the content of each of which is incorporated herein by reference in its entirety.

FIELD OF DISCLOSURE

The disclosure relates to resin systems incorporating inorganic materials. More particularly, the disclosure relates to resin systems incorporating glasses, glass ceramics, and ceramics in high load levels. In some cases, the disclosure relates to organic resin systems that incorporate proprietary glasses, glass ceramics, and ceramics in high load levels.

BACKGROUND

Additive manufacturing (AM), more commonly known as three dimensional (3D) printing or rapid prototyping, refers to processes wherein layers of material are formed under computer control to create used to create three-dimensional objects. It is a technology space that has grown into a multi-billion dollar industry that includes a myriad of processes, including extrusion deposition, light polymerization, powder bed sintering, lamination, and metal wire deposition. Such processes have been used with a variety materials, including polymers, metals, and ceramics. However, even with all this development, there continues to be a need to innovate beyond current capabilities in areas including equipment, processes, and materials.

One particular area where more additive manufacturing development is needed is in the glass and glass-ceramic space. Similar to use of AM in ceramics, the ability to create structures from glass and glass ceramic materials via 3D printing would be beneficial in that it would allow for the generation of complex structures that cannot be produced in any other way, including traditional glass shaping processes. Parts produced through additive manufacturing are often complex or have unreachable features which traditional processes cannot address. However, currently most AM efforts for glass are concentrated on re-melting and re-forming of glass to form 3D structures. Such structures tend to have limited resolution, which adversely affects the usefulness of the final products. The present disclosure provides novel binder-based processes wherein the object can be 3D formed, then subsequently sintered to produce a homogenous structure that overcomes the disadvantages of earlier processes.

SUMMARY

Some newer methods are branching into the binder-based approach described here. This invention describes a method for multi-step processing of high resolution, laser formed inorganic structures from a powder-resin matrix via Stereolithography. Efforts similar to this processing often exclude glasses and glass-ceramics, and are focused with specific metal oxides (shown in FIG. 1).

An aspect (1) of the disclosure provides a resin system comprising a resin including: 1-30 wt % of a binder comprising an organic-soluble, photopolymerizable monomer, oligomer, or polymer and >0-10 wt % of a photoinitiator; and 50-90 wt % of a filler including: glass or glass ceramic particles wherein the particles have an average size along their longest dimension of from 5 nm to 20 µm, wherein the resin system meets one or more of the following: the viscosity of the resin system is from 2000 cP to 75,000 cP; the yield stress of the resin system is from 1 to 10 Pa; the resin shows less than a 20% change in viscosity or yield stress over a period of 30 days in a hermetically sealed container at 1 atm and 25° C.; or the resin system scores a value of from 4 to 10 on the ASTM D869 settling test over a period of 48 hours.

An aspect (2) of the disclosure provides the resin system of aspect (1), comprising 2-20 wt % binder. An aspect (3) of the disclosure provides the resin system of aspect (2), comprising 5-20 wt % binder. An aspect (4) of the disclosure provides the resin system of any of aspects (1)-(3), comprising 1-15 wt % emulsion component. An aspect (5) of the disclosure provides the resin system of any of aspects (1)-(4), comprising 1.5-10 wt % emulsion component. An aspect (6) of the disclosure provides the resin system of any of aspects (1)-(5), comprising 0.1-8 wt % photoinitiator. An aspect (7) of the disclosure provides the resin system of aspect (6), comprising 0.5-5 wt % photoinitiator. An aspect (8) of the disclosure provides the resin system of any of aspects (1)-(7), comprising 50-80 wt % filler. An aspect (9) of the disclosure provides the resin system of aspect (8), comprising 60-80 wt % filler.

An aspect (10) of the disclosure provides the resin system of any of aspects (1)-(9), wherein the resin further comprises 1-20 wt % dispersant. An aspect (11) of the disclosure provides the resin system of aspect (10), comprising 1-15 wt % dispersant. An aspect (12) of the disclosure provides the resin system of aspect (11), comprising 2-12 wt % dispersant. An aspect (13) of the disclosure provides the resin system of any of aspects (1)-(12), wherein the surface of the glass or glass ceramic particles have been chemically or physically modified. An aspect (14) of the disclosure provides the resin system of aspect (13), wherein the surface of the glass or glass ceramic particles have been chemically modified. An aspect (15) of the disclosure provides the resin system of aspect (14), wherein the chemical modification comprises silination, bromination, or chlorination. An aspect (16) of the disclosure provides the resin system of aspect (13), wherein the surface of the glass or glass ceramic particles have been physically modified by thermal spherization.

An aspect (17) of the disclosure provides the resin system of any of aspects (1)-(16), wherein the resin has a yield stress of from 1 to 6 Pa. An aspect (18) of the disclosure provides the resin system of aspect (17), wherein the resin has a viscosity of from >0-2000 cP. An aspect (19) of the disclosure provides the resin system of aspect (18), wherein the resin has a >0-1000 cP or >0-200 cP. An aspect (20) of the disclosure provides the resin system of any of aspects (1)-(19), wherein the resin system has a settling range of from 4-10 based on the ASTM standard. An aspect (21) of the disclosure provides the resin system of any of aspects (1)-(20), wherein the resin system has a viscosity from 2000 cP to 50,000 cP. An aspect (22) of the disclosure provides the resin system of aspect (21), wherein the resin system has a viscosity from 2000 cP to 20,000 cP. An aspect (23) of the disclosure provides the resin system of any of aspects (1)-(22), wherein the resin system shows less than a 10% change in viscosity or yield stress over a period of 30 days in a hermetically sealed container at 1 atm and 25° C. An aspect (24) of the disclosure provides the resin system of any of aspects (1)-(23), wherein the resin system has a settling range of from 6-10 based on the ASTM D869 standard. An aspect (25) of the disclosure provides the resin system of aspect (24), wherein the resin system wherein the resin system has a settling range of from 8-10 based on the ASTM D869 standard. An aspect (26) of the disclosure provides an article having dimensions in x, y, and z Cartesian axes comprising the resin system of any of aspects (1)-(25). An aspect (27) of the disclosure provides the article of aspect (26), wherein the article has dimensions greater than 10 mm in each of the x, y, and z Cartesian axes.

These and other aspects, advantages, and salient features will become apparent from the following detailed description, the accompanying drawings, and the appended claims.

BRIEF DESCRIPTION OF THE DRAWINGS

Referring to the drawings in general, it will be understood that the illustrations are for the purpose of describing particular embodiments and are not intended to limit the disclosure or appended claims thereto. The drawings are not necessarily to scale, and certain features and certain views of the drawings may be shown exaggerated in scale or in schematic in the interest of clarity and conciseness.

DETAILED DESCRIPTION

Figure 1:
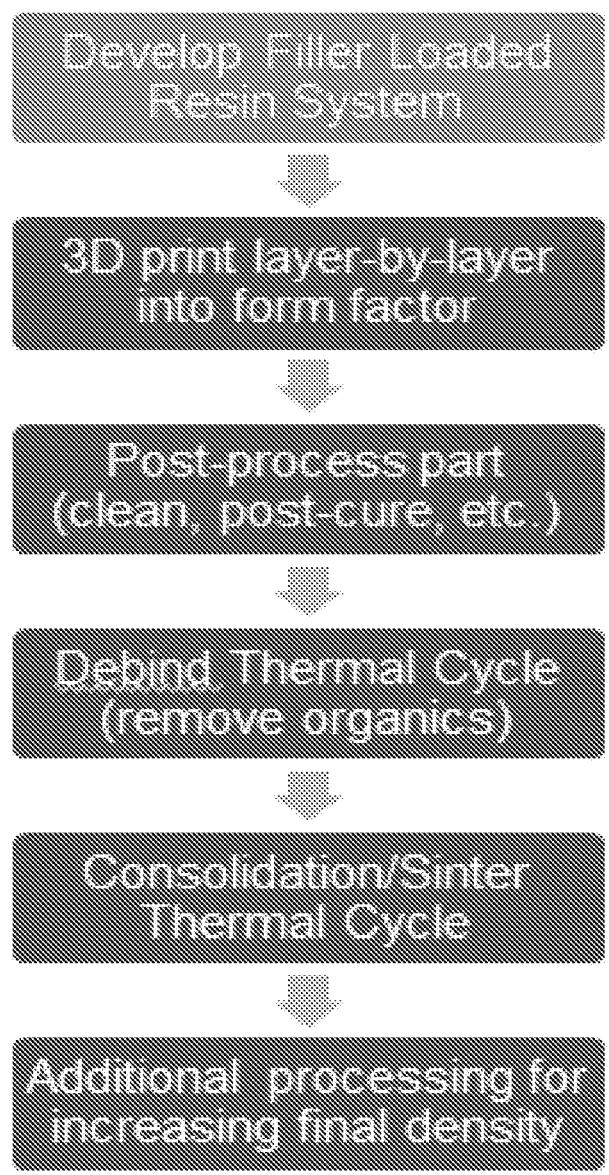
FIG. 1 is an overview of the steps in an embodied 3D printing process.
Figure 2:
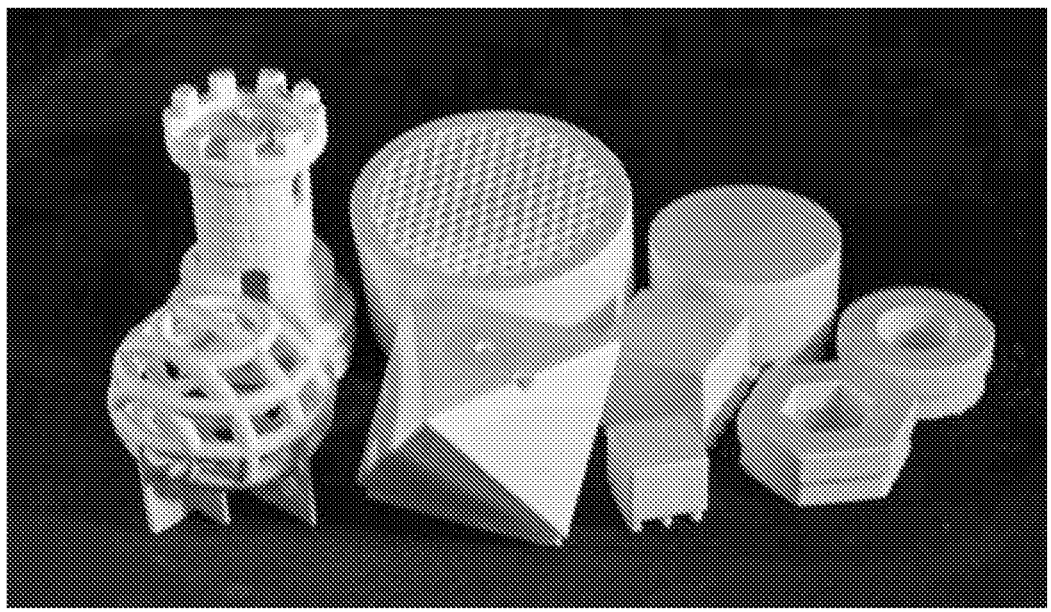
FIG. 2 is a picture showing products three dimensionally printed using materials embodied herein prior to sintering.
Figure 3:
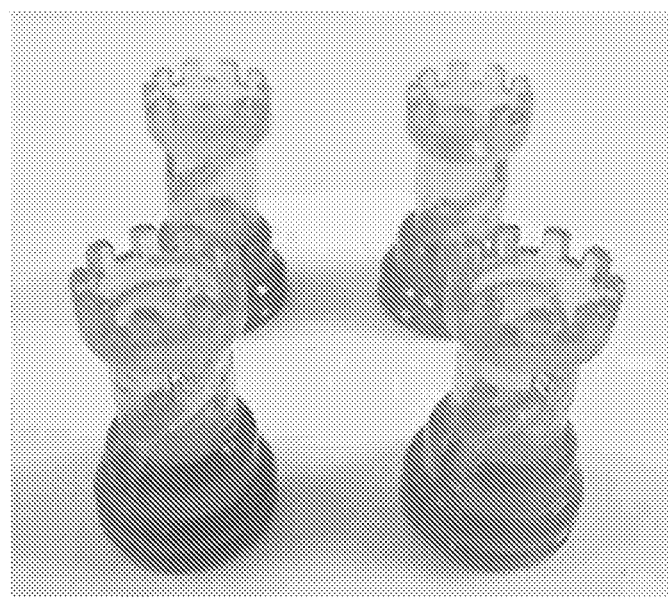
FIG. 3 is a picture showing products three dimensionally printed using materials embodied herein after sintering to produce transparent pieces.

In the following description, whenever a group is described as comprising at least one of a group of elements and combinations thereof, it is understood that the group may comprise, consist essentially of, or consist of any number of those elements recited, either individually or in combination with each other. Similarly, whenever a group is described as consisting of at least one of a group of elements or combinations thereof, it is understood that the group may consist of any number of those elements recited, either individually or in combination with each other. As used herein, the indefinite articles "a," "an," and the corresponding definite article "the" mean "at least one" or "one or more," unless otherwise specified. It also is understood that the various features disclosed in the specification and the drawings can be used in any and all combinations.

As used herein, the term "about" means that amounts, sizes, formulations, parameters, and other quantities and characteristics are not and need not be exact, but may be approximate and/or larger or smaller, as desired, reflecting tolerances, conversion factors, rounding off, measurement error and the like, and other factors known to those of skill in the art. It is noted that the terms "about," "substantially," "substantially free" and "free" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue. Thus, a glass that is "free of $Al_2O_3$" is one in which $Al_1O_3$ is not actively added or batched into the glass, but may be present in very small amounts as a contaminant (e.g., 500, 400, 300, 200, or 100 parts per million (ppm) or less or).

Where a range of numerical values is recited herein, comprising upper and lower values, unless otherwise stated in specific circumstances, the range is intended to include the endpoints thereof, and all integers and fractions within the range. It is not intended that the scope of the claims be limited to the specific values recited when defining a range. Further, when an amount, concentration, or other value or parameter is given as a range, one or more preferred ranges or a list of upper preferable values and lower preferable values, this is to be understood as specifically disclosing all ranges formed from any pair of any upper range limit or preferred value and any lower range limit or preferred value, regardless of whether such pairs are separately disclosed. Finally, when the term "about" is used in describing a value or an end-point of a range, the disclosure should be understood to include the specific value or end-point referred to. When a numerical value or end-point of a range does not recite "about," the numerical value or end-point of a range is intended to include two embodiments: one modified by "about," and one not modified by "about."

Embodied here are hybrid organic-inorganic resin systems that comprise an organic-based resin and inorganic filler. The embodied resin systems have high filler loads and can be used for additive manufacturing of inorganic materials. In particular, the resin systems can be processed into 3D shapes via stereolithography or similar processes. These green bodies can then be post-processed to remove the organics, leaving a high-density, fully-inorganic structure. The present resin system overcomes issues seen in alternative resins, such as particle settling in low viscosity solution, low particle loading, and low part shrinkage and stress build up in green or cured article.

One aspect of the embodiments described herein is that the organic resin system is readily provides flexibility in terms of the monomer, oligomer, or polymer used. While use of organic resin materials can require highly volatile organic solvents for cleaning parts post-printing, they are advantageous in that they can be more precisely tailored to the needed properties of the resin material than aqueous-based resins usually can. The embodied resin systems provide articles that can have unique attributes, such as high thermal stability, as well as being colored, transparent, or translucent, benefits not usually seen in additive manufacturing processes for polymers or metals.

Resin

Resin systems embodied herein generally comprise two main components—a resin and a filler. The resin comprises a monomer, oligomer, and/or polymer that is in a liquid phase at a temperature of from about −25° C. to 90° C., −20° C. to 80° C., −10° C. to 60° C., or 0° C. to 40° C. and that is curable via a reaction mechanism, such as photopolymerization or thermal treatment, free-radical polymerization, cationic or anionic polymerization, or step-growth polymerization. In particular, photopolymerization may advantageously be used to quickly polymerize the materials in a controlled manner. Reactive species for crosslinking may comprise organic epoxies, acrylates, cyclic oxides, polyols, polyesters, polyurethanes, pyrrolidone, isocyanate, cyclic aliphatics, or combinations thereof. In particular, multifunctional species improve the crosslink density and therefore, improve the hardness and abrasion resistance of the cured polymer. Example embodiments of organic monomers, oligomers, polymers include 45-70 wt % epoxy, 10-25 wt % acrylates, 5-15 wt % oxetane, 5-15 wt % polyol, 25-75 wt % ethoxylated bisphenol A diacrylates, or 25-75 wt % acrylate/isocyanate/polyol.

In some embodiments, the resin further comprises photoinitators (typically for reaction initiation in the blue to ultraviolet range, such as at wavelengths of 450 nm or less, for example, 410 nm or less, 405 nm or less, or at 355 nm or less). As an example, photoinitators for the 355 nm system may include: IRGACURE® 184, IRGACURE® 500, DAROCURE® MBF, IRGACURE® 754, IRGACURE® 651, IRGACURE® 4265, IRGACURE® 819/819DW, DAROCURE® 1173, IRGACURE® 819, IRGACURE® 2022, IRGACURE® 2100, IRGACURE® 784, IRGACURE® TPO and TPO-L (Ciba Specialty Chemicals). The ones most commonly used for the 355 nm system are DAROCURE® 1173 and IRGACURE® TPO-L. The 819, 2022, TPO and 2100 listed can be used to initiate a 355-405 nm system.

Viscosity modifiers may include surfactants, diluents, and dispersants or any other component which changes the overall loaded viscosity within a workable range. In the case where the pre-cured resin viscosity is >2,000 cP, it is useful to include one or more viscosity modifiers. Some examples include high vapor pressure solvents (dimethyl sulfoxide (DMSO), octanol, ethylene glycol, diethylene glycol, glycerin), reactive monomers/oligomers (SR601 (ETHOXYLATED (4) BISPHENOL A DIACRYLATE), PE210 (BISPHENOL A EPOXY ACRYLATE), SR508, SR504 (ETHOXYLATED (4) NONYL PHENOL ACRYLATE), SR 540 (ETHOXYLATED (4) BISPHENOL A DIMETHACRYLATE, M2300 (ETHOXYLATED BISPHENOL A DIACRYLATE), diluents ((SARTOMER SR504, SARTOMER SR350, SARTOMER SR644, SARTOMER SR508, trimethylolpropane ethoxylate, SARTOMER SR540), 0-5 wt % lactam), dispersants (DISPERBYK® materials), surfactants (stearates, sulfonates, ethoxylates, DEXTROL™ materials), and pH modifiers (buffers, aliphatic alcohols). Materials which aide in viscosity through filler modification can also be used in excess as functional diluents, securing a balance between the organic and inorganic section. These materials include silanes and siloxanes, such as 3-(Glycidyloxypropyl)trimethoxysilane, 3-((Methacryloyloxy)propyl)trimethoxysilane, and Triethyloxyvinylsilane. Some other pH modifiers, such as ethanol amine, are stronger than aliphatic alcohols and are used for electrostatic dispersion of particles in solution. The viscosity of the formulated resin can be determined using a viscometer. For example, the procedure used to determine the viscosity of the formulated resin was done on a Brookfield® RVDV2T Viscometer. A spindle 29 with a small sample adapter was used to run samples with a spindle speed of between 0.1 and 100 RPM and then the Hershel-Buckley fit test is applied to the data for a 99+% confidence fit to get yield stress measurements. In some embodiments, the formulated resin, comprising all the components except the filler, should have an initial, pre-loading viscosity of from >0 to 2000 cP, >0 to 1000 cP, or >0 to 200 cP.

Filler

The second component of the resin system is the filler. The filler comprises an inorganic material in particulate form. The inorganic material comprises a glass or glass ceramic, such as silica, aluminosilicates, aluminoborosilicates, alkali aluminosilicates, alkali aluminoborosilicates, and combinations thereof. The filler may also comprise glass-ceramics, ceramics, and ion-exchangeable glasses or glass-ceramics. Particle size distribution is determined by a Microtrac® Particle Analyzer. The particles can have an average size along their longest dimension of from 40 nm to 20 µm, 40 nm to 15 µm, 40 nm to 10 µm, 40 nm to 5 µm, 40 nm to 2 µm, 40 nm to 1 µm, 100 nm to 20 µm, 100 nm to 15 µm, 100 nm to 10 µm, 100 nm to 5 µm, 100 nm to 2 µm, 100 nm to 1 µm, 500 nm to 20 µm, 500 nm to 15 µm, 500 nm to 10 µm, 500 nm to 5 µm, 500 nm to 2 µm, 500 nm to 1 µm, 1 µm to 20 µm, 1 µm to 15 µm, 1 µm to 10 µm, 1 µm to 5 µm, or 1 µm to 2 µm. In some embodiments, the particles can have a $D_{50}$ along their longest dimension of from 100 nm to 8 µm, 100 nm to 200 nm, or 2 µm to 7 µm.

Examples of specific embodied fillers include:

1) Fumed silica particles (roughly spherical) having a particle size distribution (PSD) range of 5 nm to 500 nm. For example, a fumed silica particle blend having a particle D50 of 125 nm and having improved strength properties. In some embodiments, D-values are used to describe particle size distributions. A D-value can be thought of as a "mass division diameter." It is the diameter which, when all particles in a sample are arranged in order of ascending mass, divides the sample's mass into specified percentages. The percentage mass below the diameter of interest is the number expressed after the "D." Thus the D50 diameter of a collection of particle samples is the diameter at which 50% of a sample's mass is composed of smaller particles. The D50 is also known as "mass median diameter" as it divides the sample equally by mass. PCT/US2017/022666, herein incorporated by reference in its entirety, teaches methods of forming fumed silica particles in this range in both single and bimodal distributions via soot formation by one or more burners. The composition may further include nano-fumed silica particles as a thixotrop. The ability to form a highly loaded system with nano-materials while still maintaining a low viscosity is a novel attribute.

2) Ultra low expansion glass having a distribution similar to that of the fumed silica, but with particles in the range of 10 nm to 800 nm.

3) PYREX®, MACOR®, LOTUS®, GORILLA® or EAGLE XG® glasses, for example as shown in U.S. Pat. Nos. 8,367,208, 8,598,055, 8,763,429, 8,796,165, and 9,517,967 and U.S. Publ. Nos. 2014/0106172 and 2015/0140299, all of which are herein incorporated by reference in their entireties, ground to have particle distributions between 1 and 12 microns. These materials may or may not have additional colorants added.

The filler may further comprise additional components, such as ceramics, other elemental or compositional components, such as glasses or glass ceramics, as well as fillers, coloring agents, and any additional oxides or fining agents such as $SnO_2$, $ZrO_2$, ZnO, $TiO_2$, $Cl^-$ and any mixtures of the like.

Powders can possess irregular morphologies as result from grinding processes or spherical from combustion or thermal processes. Particles can be modified chemically or physically to increase loading and particle packing (via processes such as microsphere flame spray, plasma melt, solution condensation reactions). For example, physically altering particles to be spherical may be advantageous in certain situations because spherical particles have improved packing density, allowing for higher concentrations of loaded resin materials, and improved slip conditions compared to non-spherical particles, reducing the overall viscosity of the resin system.

In addition to physical modifications, the particles can include chemical modifications which adapt the surface energy of the particles and can provide electronic and steric advantages (such as silanation to intentionally modify the electronic surface of specific inorganics. Some surface enhancing moieties include silanating materials used include 3-Glycidyloxypropyl)trimethoxysilane, 3-(Methacryloyloxy)propyl]trimethoxysilane, Triethyloxyvinylsilane, amine, acrylic, and glycidyl silanes which are typically trimethyoxy groups. Controlling the particle-surface properties is especially critical for materials with high surface area, such as the sub-micron powders, and or highly charged inorganic surfaces to allow for high particle loading of 60% vol.

Resin System

The resin system comprises the combination of the resin and filler. In order to effectively be three-dimensionally printed, the resin system needs to have certain physical properties that are conducive to good flow while providing the structure necessary to allow 3D building. Typically, the materials disclosed herein are used in a system where they are passed through a forming or printing head and then cured before the next layer is formed on top. This layer-by-layer approach allows for the building of complex articles and shapes. The following aspects of the resin system allow for improved 3D forming.

The viscosity of the resin system controls the flowability and formability of the material. The material must be viscous enough to allow for building and structure retention, while still allow for easy flow from the forming head. In some embodiments, the viscosity of the resin system is from 2000 cP to 75,000 cP, 2000 cP to 50,000 cP, 2000 cP to 25,000 cP, 2000 cP to 20,000 cP, 2000 cP to 15,000 cP, or 2000 cP to 10,000 cP.

Similarly, the yield stress of the resin system allows it to flow like a liquid at high stresses, but maintain structural integrity under normal loading conditions. In some embodiments, the yield stress is from 1 to 40 Pa, 1 to 20 Pa, 1 to 15 Pa, 1 to 10 Pa, 1 to 8 Pa, or 1 to 6 Pa.

The stability of the resin system allows for reduced cost and improved long term productivity. In some embodiments the resin shows less than a 10 or 20% change in viscosity or yield stress over a period of 30 days in an air tight or hermetic, sealed container at 1 atm and 25° C. Similarly, a resin that is resistant to settling or separation allows for the formation of more homogeneous articles and allows for use of the resin for longer periods without having to mix or monitor the resin system. In some embodiments, the resin system scores a value of from 4 to 10, 6 to 10, or 8 to 10 on the ASTM D869 settling test over a period of 48 hours.

Example embodiments of resin systems are given in Table 1. Embodiment 1 comprises a fumed silica system, Embodiment 2 comprises a Gorilla® Glass system, Embodiment 2 comprises another Gorilla® Glass system, Embodiment 4 comprises another Gorilla® Glass system with improved stability (long shelf life, anti-settling), Embodiment 5 comprises a borosilicate system, Embodiment 6 comprises a Gorilla® Glass system blended with a commercially available resin system listed in example 15 as the Water Clear Ultra.

| Component | Embodiments (Wt %) | | |
| --- | --- | --- | --- |
| | Embodiment 1 | Embodiment 2 | Embodiment 3 |
| Mono/polymer | 12.68 | 6.13 | 7.56 |
| Water | 7.28 | 0.00 | 0.00 |
| Dispersant | 2.90 | 8.43 | 7.56 |
| Modifiers | 4.35 | 8.05 | 9.07 |
| Photoinitiator | 1.45 | 0.77 | 0.25 |
| Filler/particles | 71.33 | 76.63 | 75.57 |
| Total | 100.00 | 100.00 | 100.00 |

| Component | Embodiments (Wt %) | | |
| --- | --- | --- | --- |
| | Embodiment 4 | Embodiment 5 | Embodiment 6 |
| Mono/polymer | 7.15 | 21.35 | 10.79 |
| Water | 0.00 | 0.00 | 1.73 |
| Dispersant | 6.85 | 0.21 | 1.15 |
| Modifiers | 11.92 | 1.99 | 10.79 |
| Photoinitiator | 0.03 | 0.5-5 | 0.5-5 |
| Filler/particles | 74.05 | 76.45 | 75.54 |
| Total | 100.00 | 100 | 100 |

Formed Article

As detailed below, after the resin system is formed, the resin can be printed and subsequently exposed to radiation to initiate polymerization and fix the resin in a formed state. Subsequent to such polymerization, the article can be post-processed via most traditional methods used for glasses and well known in the art, such as chemical tempering via ion exchange, chemical or physical etching, polishing, etc.

The embodiments herein can be used to produce 3D articles out of glass or glass ceramic materials that have unique properties not possible via other means, can provide cost savings and/or improved timeline compared to other machining methods, and allow for generation of high resolution articles on a SLA instrument through laser-processed materials rather than via glass extrusion or melting. In addition, while processed similar to polymer systems, the 3D printed articles can have properties much different from the resin system or polymer resin, such as high strengths and hardnesses.

Process

FIG. 1 graphically shows the process steps for forming a 3D shaped glass or glass ceramic article using the resin systems described herein. Step 1 comprises forming the resin system and can be broken into three steps: 1) resin formation; 2) filler formation; and 3) combining the resin and the filler.

Resin formation—The resin can be formed via any number of processes known in the art and described herein for forming and batching monomers into an organic solution. For example, the resin monomers (10-20 wt %) may be combined with a solvent (25-50 wt %) along with any additional dispersants, emulsifiers, surfactants or viscosity modifiers, and stirred and optionally heated to form an approximately homogenous solution.

Filler formation—glass or glass ceramic particles can be formed via known methods. The particles can be treated via mechanical, chemical or thermal means to modify their size and surface properties. For example, flame processing can be used to modify mechanically ground particles having sharp edges into smooth spherical particles. The particles can then optionally undergo surface treatment, such as silanation, to modify the surface energy of the particles. The particles are then mixed with a surface modifier, such as a silane, chlorane, acrylate, for example Pentafluorophenylacrylate (PFMA), Pentafluorophenylacrylate (PFPA), Tetrachloroethylacrylate (TeCEA) or 2-Chloroethyl acrylate, or an acetate, for example 3-Chloro-2-oxopropyl acetate, in water or isopropyl alcohol and dried to remove solvent to form a filler composition comprising >60 wt % glass or glass ceramic and 3-15 wt % surface modifier.

Mixing—once the resin and filler are formed, the two can be combined and thoroughly mixed using known means to produce the resin system. The final mixture can have from 5-30 wt % binder and 70-95 wt % filler (where the filler comprises >60 wt % glass or glass ceramic), along with optional photoinitiators (1-3 wt %), dispersants, and surfactants.

Additional Mixture Processing—Mixtures of filler and resin can optionally be further processed for incorporation, such as by 3-roll milling or traditional milling. De-aeration processing is often required to remove any entrapped gas before entering the 3D printing chamber. This is especially true for high viscosity (>10,000 cP) materials. De-aeration can be performed through planetary mixers, material rolling, or vacuum processes.

Forming—Once material is ready for print, it is loaded into the resin chamber of the 3D printing equipment. In this case, the platform moves top-down for each layer. The plate moves at <0.010" increments. Viscosity of the material is such is it able to flow over the surface. A traversing blade further smooths the layer to a uniform surface. A YAG UV-laser selectively cures the resin. Laser parameters are developed in a previous process step where the laser power, scan speeds, and spot size are altered to tune in the desired cure energy for an initial layer thickness (<0.020") and cure accuracy (<20 microns from design). The process is repeated until all steps are finished to form the part. The plate moves back to the home position above the resin surface while the resin drips. Parts are cleaned using various physical and chemical methods (solvents, brushes) and further cured in a flood cure oven for 30-45 minutes.

Post Processing—Subsequent to polymerization, the article can be post-processed via most traditional methods used for glasses and well known in the art, such as chemical tempering via ion exchange, chemical or physical etching, polishing, etc.

EXAMPLES

I. Organic Systems

Example 1: Epoxy resin with borosilicate glass—Borosilicate solid glass spheres (60 vol %) in an epoxy-based resin (WCU or Element commercial resin systems) (Embodiment 5) (38 vol %) are combined with a surfactant/diluent/dispersant (2 vol %). The two are blended together using a Cowles mixer with cooling jacket and transferred to a 3-roll mill to further disperse the particles in the organic resin.

Example 2: Epoxy resin with MACOR® block "green" ceramic—MACOR®-block "green" ceramic powder is crushed to a particle size of 3-5 μm ($D_{50}$) (59 vol %) in an epoxy-based resin (31 vol %) and combined with a surfactant/diluent/dispersant (10 Vol %). The two are blended together using a Cowles mixer with cooling jacket and transferred to a 3-roll mill to further disperse the particles in the organic resin.

Example 3: Epoxy resin with BM5 glass—BM5 glass—ground to a $D_{50}$=19 μm is loaded to 60 vol % in an epoxy resin (34 vol %) and combined with a surfactant/diluent/dispersant (6 vol %). The two are blended together using a Cowles mixer with cooling jacket and transferred to a 3-roll mill for a more thorough dispersion of the particles in the organic resin.

Example 4: Epoxy resin with LOTUS® Glass—LOTUS® glass is ground to a $D_{50}$=3-5 μm and loaded at 56 vol % in an epoxy resin (25 vol %) with a surfactant/diluent/dispersant (19 vol %). The two are blended together using a Cowles mixer with cooling jacket and transferred to a 3-roll mill for a more thorough dispersion of the particles in the organic resin.

Example 5: Epoxy resin with GORILLA® Glass—GORILLA® Glass is ground to a $D_{50}$=3-5 μm and loaded at 58 vol % in an epoxy resin (24 vol %) with a surfactant/diluent/dispersant (18 vol %). The two are blended together using a Cowles mixer with cooling jacket and transferred to a 3-roll mill for a more thorough dispersion of the particles in the organic resin.

Example 6: Epoxy resin with GORILLA® Glass—GORILLA® Glass is ground to a $D_{50}$=3-5 μm and loaded at 60 vol % in an epoxy resin (22 vol %) with surfactant/diluent/dispersant (19 vol %). The two are blended together using a Cowles mixer with cooling jacket and transferred to a 3-roll mill for a more thorough dispersion of the particles in the organic resin.

Example 7: Epoxy resin with GORILLA® Glass—GORILLA® Glass is ground to a $D_{50}$=3-5 μm and silanated using a multi-functional silyl-methacrylate (3-trimethyoxysilypropyl methacrylate) and loaded to 60 vol % in an epoxy resin (22 vol %) with a surfactant/diluent/dispersant (19 vol %). The two are blended together using a Cowles mixer with cooling jacket and transferred to a 3-roll mill for a more thorough dispersion of the particles in the organic resin.

Example 7: Epoxy resin with silanated fumed silica—Fumed silica ($D_{50}$=125 nm) is surface treated with a multi-functional silyl-methacrylate (3-trimethyoxysily-propyl methacrylate) prior to resin incorporation, providing a surface modification to improve inorganic loading in an epoxy based resin. Because the silica is formed through a combustion process, particles are largely spherical. The methacrylate function of the silylmethacrylate reacts with the silica surface to enhance the dry and wet adhesion while reducing the cathotic disbondment. Siloxanes, silanes, and other silyl containing functionalities are considered reactive constituents which also participate in silica formation during sintering and consolidation, a similar effect to polymer derived ceramics. The final mixture contains 40-60 vol % (up to 75 wt %) surface treated fumed silica and up to 30 wt % resin binder solution. The final mixture may also contain up to 15 wt % reactive diluents which may participate in the silica condensation reaction upon firing. These may include 3-(2,3-Epoxypropoxy)propyltrimethoxysilane, cyclotetrasiloxanes, tetraethylorthosilicates, etc. These blends are processed through a 3-roll mill after initial mixing for full incorporation.

Example 8: Acrylate resin with silanated fumed silica—In another embodiment, fumed silica ($D_{50}$=125 nm) is surface treated with a multi-functional organofunctional alkoxysilane (3-(2,3-Epoxypropoxy)propyltrimethoxysilane), providing a surface modification to improve loading in an acrylate resin. This resin is an acrylate/isocyanate/polyol blend that is diluted to between 25-75% with Trimethylolpropane ethoxylate (1 EO/OH) methyl ether diacrylate, a reactive diluent. The final mixture can contain 40-60 vol % (up to 75 wt %) surface treated fumed silica and up to 30 wt % monomer binder solution. The final mixture may also contain up to 15 wt % reactive diluents which may participate in the silica condensation reaction upon firing. These may include 3-(2,3-Epoxypropoxy)propyltrimethoxysilane, cyclotetrasiloxanes, tetraethylorthosilicates, etc. These blends are processed through a 3-roll mill after initial mixing to full incorporation.

Example 9: Acrylate resin with silanated fumed silica and pH modifiers—In another embodiment, the mixture is similar to that of Example 8. Like Example 8, fumed silica is surface treated with a multi-functional organofunctional alkoxysilane (i.e. (3-(2,3-Epoxypropoxy)propyltrimethoxysilane or triethoxyvinylsilane) and the resin is an acrylate/isocyanate/polyol blend that has been diluted between 25-75% with Trimethylolpropane ethoxylate (1 EO/OH) methyl ether diacrylate, a reactive diluent. A pH modifier (ethanol amine, ammonium hydroxide, ethylene diamine etc.) is loaded between 20 and 1000 ppm for effective viscosity reduction, partially acting as electrostatic dispersant to the filler media or an entanglement modifier for increased steric dispersion. The final mixture can contain 40-60 vol % (up to 75 wt %) surface treated fumed silica and up to 30 wt % monomer binder solution. The final mixture may also contain up to 15 wt % reactive diluents which may participate in the silica condensation reaction upon firing. These may include 3-(2,3-Epoxypropoxy)propyltrimethoxysilane, cyclotetrasiloxanes, tetraethylorthosilicates, etc. These blends are processed through a 3-roll mill after initial mixing to full incorporation.

Example 10: Acrylate resin with LOTUS® RS Glass—In another embodiment, Corning LOTUS® RS glass is initially ground to an overall size distribution <12 microns and blended with an acrylate/isocyanate/polyol resin blend that has been diluted between 25 and 75% with Trimethylolpropane ethoxylate (1 EO/OH) methyl ether diacrylate, a reactive diluent. Modifiers for pH regulation are included to adjust loading (ethanol amine, ammonium hydroxide, ethylene diamine etc.) and are added between 20 and 1000 ppm for effective viscosity reduction. The final mixture can contain 40-60 vol % (up to 75 wt %) surface treated glass and up to 30 wt % monomer binder solution. The final mixture may also contain up to 15 wt % reactive diluents which may participate in the silica condensation reaction upon firing. These may include 3-(2,3-Epoxypropoxy)propyltrimethoxysilane, cyclotetrasiloxanes, tetraethylorthosilicates, etc. These blends are processed through a 3-roll mill after initial mixing to full incorporation.

Example 11: Acrylate resin with morphology modified LOTUS® RS Glass—In another embodiment, Corning LOTUS® RS glass is initially ground to an overall size distribution<12 micron and then treated with flame spray or plasma melt for morphology modification prior to blending with an acrylate/isocyanate/polyol resin blend that has been diluted between 25 and 75% with a reactive diluent (Trimethylolpropane ethoxylate (1 EO/OH) methyl ether diacrylate). Modifiers for pH regulation are included to adjust loading (ethanol amine, ammonium hydroxide, ethylene diamine etc.) and are added between 20 and 1000 ppm for effective viscosity reduction. The final mixture can contain 40-60 vol % (up to 75 wt %) surface treated glass and up to 30 wt % monomer binder solution. The final mixture may also contain up to 15 wt % reactive diluents which may participate in the silica condensation reaction upon firing. These may include 3-(2,3-Epoxypropoxy)propyltrimethoxysilane, cyclotetrasiloxanes, tetraethylorthosilicates, etc. These blends are processed through a 3-roll mill after initial mixing for full incorporation.

Example 12: Acrylate resin with surface modified LOTUS® RS Glass—In another embodiment, Coming LOTUS® RS glass is initially ground to an overall size distribution<12 micron and then treated with flame spray or plasma melt to form spherical particles prior to surface modification. The Lotus particles are surface treated with a multi-functional organofunctional alkoxysilane (i.e. (3-(2,3-Epoxypropoxy)propyltrimethoxysilane or triethoxyvinylsilane), providing a surface modification to improve loading in an acrylate/isocyanate/polyol resin blend that has been diluted between 25 and 75% with a reactive diluent (Trimethylolpropane ethoxylate (1 EO/OH) methyl ether diacrylate). Modifiers for pH regulation are included to adjust loading (ethanol amine, ammonium hydroxide, ethylene diamine etc.) and are added between 20 and 1000 ppm for effective viscosity reduction. Photoinitiators for improved cure speed could also be included between 0 and 5 wt %. The final mixture can contain 40-60 vol % (up to 75 wt %) surface treated glass and up to 30 wt % monomer binder solution. The final mixture may also contain up to 15 wt % reactive diluents which may participate in the silica condensation reaction upon firing. These may include 3-(2,3-Epoxypropoxy)propyltrimethoxysilane, cyclotetrasiloxanes, tetraethylorthosilicates, etc. These blends are processed through a 3-roll mill after initial mixing for full incorporation.

Example 13: Acrylate resin with ultralow expansion (ULE) glass—In another embodiment, fumed ULE glass powder is surface treated with a multi-functional organofunctional alkoxysilane (i.e. (3-(2,3-Epoxypropoxy)propyltrimethoxysilane), providing a surface modification to improve loading in an acrylate resin. The resin is an acrylate/isocyanate/polyol blend that has been diluted between 25 and 75% with Trimethylolpropane ethoxylate (1 EO/OH) methyl ether diacrylate, a reactive diluent. The final mixture can contain 40-60 vol % (up to 75 wt %) surface treated ULE material and up to 30 wt % monomer binder solution. The final mixture may also contain up to 15 wt % reactive diluents which may participate in the silica condensation reaction upon firing. These may include 3-(2,3-Epoxypropoxy)propyltrimethoxysilane, cyclotetrasiloxanes, tetraethylorthosilicates, etc. Due to light scattering events from the increased titanium oxide composition, additional photoinitiators could be included for improved cure character. These include 1173 Type I photoinitiators, TPO and TPO-L Type I Photoinitiators, or 184 Type I photoinitiators for improved norrish type I free radical events. Alternatively, Benzophenone, quinones, etc for norrish type II cationic events have been used. These blends are processed through a 3-roll mill after initial mixing for full incorporation.

Example 14: Acrylate resin with surface modified GORILLA® Glass—In another embodiment, Corning's GORILLA® Glass is initially ground to an overall size distribution<12 micron and then silanated with a multi-functional organofunctional alkoxysilane (i.e. (3-(2,3-Epoxypropoxy)propyltrimethoxysilane or triethoxyvinylsilane), providing a surface modification to improve loading in an acrylate/isocyanate/polyol resin blend. Modifiers for pH regulation are included to adjust loading (ethanol amine, ammonium hydroxide, ethylene diamine etc.) and are added between 20 and 1000 ppm for effective viscosity reduction. Photoinitiators for improved cure speed could also be included between 0 and 5 wt %. The final mixture can contain 40-60 vol % (up to 75 wt %) surface treated glass and up to 30 wt % monomer binder solution. The final mixture may also contain up to 15 wt % reactive diluents which may participate in the silica condensation reaction upon firing. These may include 3-(2,3-Epoxypropoxy)propyltrimethoxysilane, cyclotetrasiloxanes, tetraethylorthosilicates, etc.

Example 15: Epoxy-Acrylate Resins—In other embodiments, two possible resins (Element Resin and Water Clear Ultra 10122 Resin (DSM SOMOS)) comprise the following components in the listed weight percentages:

| Element Resin | |
|---|---|
| Ingredient | Wt. % |
| Epoxy | 25-50 |
| Monomer | 25-50 |
| Monomer | 10-25 |
| Multifunctional acrylate | 5-10 |
| Multifunctional acrylate | 1-5 |
| Additivess | 1-5 |
| Multifunctional acrylate | 0.1-1 |
| Copper compounds | <0.1 |

| Water Clear Ultra Resin | |
|---|---|
| Ingredient | Wt. % |
| Epoxy | 20-80 |
| Ocetane | 10-30 |
| Multifunctional acrylate | 5-35 |
| Polyol | 10-25 |
| Photoinitiators | 1-15 |
| Additives | 0-5 |
| Antimony compounds | 1.8 |

The invention claimed is:

1. A resin system comprising:
   a. a resin including:
      i. 1-30 wt % of a binder comprising an organic photopolymerizable monomer, oligomer, or polymer, wherein the organic photopolymerizable monomer, oligomer, or polymer is a liquid at a temperature from −25° C. to 90° C.;
      ii. >0-10 wt % of a photoinitiator; and
   b. 50-90 wt % of a filler including:
      i. glass or glass ceramic particles wherein the particles have an average size along their longest dimension of from 5 nm to 20 nm;
   c. wherein the resin system meets one or more of the following:
the viscosity of the resin system is from 2000 cP to 75,000 cP;
the yield stress of the resin system is from 1 to 10 Pa;
the resin system shows less than a 20% change in viscosity or yield stress over a period of 30 days in a hermetically sealed container at 1 atm and 25° C.; or
the resin system scores a value of from 4 to 10 on the ASTM D869 settling test over a period of 48 hours.

2. The resin system of claim 1, comprising 2-20 wt % binder.

3. The resin system of claim 2, comprising 5-20 wt % binder.

4. The resin system of claim 1, comprising 1-20 wt % emulsion component.

5. The resin system of claim 4, comprising 1.5-15 wt % emulsion component.

6. The resin system of claim 1, comprising 0.1-8 wt % photoinitiator.

7. The resin system of claim 6, comprising 0.5-5 wt % photoinitiator.

8. The resin system of claim 1, comprising 50-80 wt % filler.

9. The resin system of claim 1, wherein the organic-soluble, photopolymerizable monomer, oligomer or polymer comprises an epoxy, an acrylate, a diacrylate, a highly ethoxylated diacrylate, a cyclic oxide, a polyol, a polyester, a polyurethane, a pyrrolidone, an isocyante, a cyclic aliphatic, or combinations thereof.

10. The resin system of claim 1, wherein the resin system comprises a combination of acrylates, diacrylates, highly ethoxylated diacrylates, silanes, photoinitiators, high MW solvents, and dispersants.

11. The resin system of fief claim 1, wherein the resin further comprises 1-20 wt % dispersant.

12. The resin system of claim 10, comprising 1-15 wt % dispersant.

13. The resin system of claim 11, comprising 2-12 wt % dispersant.

14. The resin system of claim 1, wherein the surface of the glass or glass ceramic particles have been chemically or physically modified.

15. The resin system of claim 13, wherein the surface of the glass or glass ceramic particles have been chemically modified.

16. The resin system of claim 14, wherein the chemical modification comprises silination, bromination, or chlorination.

17. The resin system of claim 13, wherein the surface of the glass or glass ceramic particles have been physically modified by thermal spherization.

18. The resin system of claim 1, wherein the resin has a viscosity of from >0 to 2000 cP.

19. The resin system of claim 17, wherein the resin has a viscosity of from >0-1000 cP.

20. The resin system of claim 17, wherein the resin has a viscosity of from >0-200 cP.

21. The resin system of claim 1, wherein the resin system has a viscosity from 2000 cP to 50,000 cP.

22. The resin system of claim 21, wherein the resin system has a viscosity from 2000 cP to 20,000 cP.

23. The resin system of claim 1, wherein the resin system shows less than a 10% change in viscosity or yield stress over a period of 30 days in a sealed container at 1 atm and 25° C.

24. The resin system of claim 1, wherein the resin system has a settling range of from 6-10 based on the ASTM D869 standard.

25. The resin system of claim 24, wherein the resin system has a settling range of from 8-10 based on the ASTM D869 standard.

26. An article having dimensions in x, y, and z Cartesian axes comprising the resin system of claim 1.

27. The article of claim 26, wherein the article has dimensions greater than 10 mm in each of the x, y, and z Cartesian axes.

* * * * *

UNITED STATES PATENT AND TRADEMARK OFFICE
CERTIFICATE OF CORRECTION

PATENT NO. : 11,912,860 B2
APPLICATION NO. : 17/043039
DATED : February 27, 2024
INVENTOR(S) : Laura Beth Cook et al.

It is certified that error appears in the above-identified patent and that said Letters Patent is hereby corrected as shown below:

In the Claims

In Column 13, Line 51, in Claim 1, delete "20 nm;" and insert -- 20 µm; --.

In Column 14, Line 21, in Claim 11, delete "fief".

Signed and Sealed this
Second Day of July, 2024

Katherine Kelly Vidal
*Director of the United States Patent and Trademark Office*